(12) United States Patent
Woo et al.

(10) Patent No.: US 9,406,616 B2
(45) Date of Patent: Aug. 2, 2016

(54) MERGED SOURCE/DRAIN AND GATE CONTACTS IN SRAM BITCELL

(71) Applicant: GLOBALFOUNDRIES Inc., Grand Cayman (KY)

(72) Inventors: Youngtag Woo, San Ramon, CA (US); Ryan Ryoung-han Kim, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/561,359

(22) Filed: Dec. 5, 2014

(65) Prior Publication Data

US 2016/0163644 A1  Jun. 9, 2016

(51) Int. Cl.
| | |
|---|---|
| H01L 27/12 | (2006.01) |
| H01L 21/84 | (2006.01) |
| H01L 27/092 | (2006.01) |
| H01L 23/535 | (2006.01) |
| H01L 27/11 | (2006.01) |
| H01L 21/285 | (2006.01) |
| H01L 21/768 | (2006.01) |

(52) U.S. Cl.
CPC ........ *H01L 23/535* (2013.01); *H01L 21/28518* (2013.01); *H01L 21/76897* (2013.01); *H01L 21/845* (2013.01); *H01L 27/0924* (2013.01); *H01L 27/1104* (2013.01); *H01L 27/1211* (2013.01)

(58) Field of Classification Search
CPC ............... H01L 27/0924; H01L 21/823821; H01L 21/845; H01L 27/1211
USPC ........................................ 257/350; 438/155
See application file for complete search history.

(56) References Cited

U.S. PATENT DOCUMENTS

2013/0235652 A1* 9/2013 Liaw .................. H01L 27/0207
                                                                   365/156

* cited by examiner

*Primary Examiner* — Thomas L Dickey
*Assistant Examiner* — Changhyun Yi
(74) *Attorney, Agent, or Firm* — Ditthavong & Steiner, P.C.

(57) ABSTRACT

A method of forming a semiconductor device with uniform regular shaped gate contacts and the resulting device are disclosed. Embodiments include forming first and second gate electrodes adjacent one another on a substrate; forming at least one trench silicide (TS) on the substrate between the first and second gate electrodes; forming a gate contact on the first gate electrode, the gate contact having a regular shape; forming a source/drain contact on a trench silicide between the first and second gate electrodes, wherein an upper portion of the source/drain contact overlaps an upper portion of the gate contact.

21 Claims, 4 Drawing Sheets

BACKGROUND

BACKGROUND

US 9,406,616 B2

MERGED SOURCE/DRAIN AND GATE CONTACTS IN SRAM BITCELL

TECHNICAL FIELD

The present disclosure relates to fabrications of static random access memory (SRAM) bitcells. The present disclosure is particularly applicable to gate contacts in SRAM bitcells for the 10 nanometer (nm) technology node and beyond.

BACKGROUND

Conventionally, gate contacts are formed as both rectangles and squares, depending on their locations in an SRAM bitcell. Specifically, rectangular shaped gate contacts are formed on gate electrodes to connect the gate electrodes to trench silicides (TS), on the active or source/drain regions, to create a cross-coupling of the gate electrodes. For example, as illustrated in FIGS. 1A and 1B, gate contacts 101 are formed over gate electrodes 103. Within cross-couple region 105, the gate contacts 101 each connect a gate electrode 103 and a TS 107, which is formed between adjacent gate electrodes on the active areas of a substrate 109. The gate contacts in the cross-couple region 105 are rectangular, whereas gate contacts elsewhere in the bitcell are square. Also shown in FIGS. 1A and 1B are square source/drain contacts 111 formed over TS 107 and connected to a metal 1 (M1) layer 113 through vias 115. Some of the vias are formed directly over the source/drain contacts 111 (such as at 117), whereas others merely overlap. Further, some of the gate electrodes 103 are formed over a shallow trench isolation (STI) region 119 in substrate 109.

Multiple shapes for the gate contacts causes printability issues, particularly with more advanced technology nodes and further scaling down of semiconductor devices. In addition, as shown in FIG. 1B, the limited spacing 119 between the rectangular gate contact 101 and the adjacent gate electrode 103 in the cross-couple region 105 can reduce yield as design rules are violated, especially as the contacted poly pitch (CPP) 121 continues to shrink.

A need therefore exists for methodology enabling formation of uniform regular shaped gate contacts and the resulting device.

SUMMARY

An aspect of the present disclosure is a method including forming uniform regular shaped gate contacts.

Another aspect of the present disclosure is a device including uniform regular-shaped gate contacts.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming first and second gate electrodes adjacent one another on a substrate; forming at least one trench silicide (TS) on the substrate between the first and second gate electrodes; forming a gate contact on the first gate electrode, the gate contact having a regular shape; forming a source/drain contact on a trench silicide between the first and second gate electrodes, wherein an upper portion of the source/drain contact overlaps an upper portion of the gate contact.

Aspects of the present disclosure include the regular shape including a square. Further aspects include the source/drain contact including a self-aligned contact. Other aspects include forming a second source/drain contact on a second TS between the first and second gate electrodes and a second gate contact having the regular shape on the second gate electrode, wherein an upper portion of the second source/drain contact overlaps an upper portion of the second gate contact. Another aspect includes the overlapping first gate contact and first source/drain contact and the overlapping second gate contact and second source/drain contact cross-coupling the first and second gate electrodes. An additional aspect includes a width of a bottom surface of the gate contact corresponding to a width of each of the first and second gate electrodes. Further aspects include forming additional gate electrodes parallel to and spaced from the first and second gate electrodes; forming at least one additional TS between each pair of adjacent gate electrodes; forming at least one additional gate contact having the regular shape on at least one additional gate electrode; and forming at least one additional source/drain contact on one or more of the at least one additional TSs. Other aspects include connecting one or more of the additional source/drain contacts and the additional gate contacts to a first metal (M1) layer above the gate electrodes and the TSs.

Another aspect of the present disclosure is a device including: first and second gate electrodes adjacent one another on a substrate; at least one trench silicide (TS) on the substrate between the first and second gate electrodes; a gate contact on the first gate electrode, the gate contact having a regular shape; a source/drain contact on a trench silicide between the first and second gate electrodes, wherein an upper portion of the source/drain contact overlaps an upper portion of the gate contact.

Aspects include the regular shape including a square. Further aspects include the source/drain contact including a self-aligned contact. Additional aspects include a second source/drain contact on a second TS between the first and second gate electrodes and a second gate contact having the regular shape on the second gate electrode, wherein an upper portion of the second source/drain contact overlaps an upper portion of the second gate contact. Another aspect includes the overlapping first gate contact and first source/drain contact and the overlapping second gate contact and second source/drain contact cross-coupling the first and second gate electrodes. Other aspects include a width of a bottom surface of the gate contact corresponding to a width of each of the first and second gate electrodes. Further aspects include additional gate electrodes parallel to and spaced from the first and second gate electrodes; at least one additional TS between each pair of adjacent gate electrodes; at least one additional gate contact having the regular shape on at least one additional gate electrode; and at least one additional source/drain contact on one or more of the at least one additional TSs. Other aspects include one or more of the additional source/drain contacts and the additional gate contacts being connected to a M1 layer above the gate electrodes and the TSs.

Another aspect of the present disclosure is a method including: forming plural parallel and equally spaced gate electrodes on a substrate; forming trench silicides (TSs) on the substrate between pairs of adjacent gate electrodes; forming gate contacts on plural gate electrodes, the gate contacts having a uniform, regular shape, where a width of a bottom surface of each gate contact corresponds to a width of each gate electrode; forming source/drain contacts on plural TSs, wherein an upper portion of a first source/drain contact on a first TS overlaps an upper portion of a first gate contact on an adjacent first gate electrode, and an upper portion of a second source/drain contact on the first TS overlaps an upper portion of a second gate contact on a second gate electrode adjacent the first TS, cross-coupling the first and second gate electrodes.

Aspects include the regular shape including a square. Additional aspects include the source/drain contacts including self-aligned contacts. Another aspect includes connecting one or more of the additional source/drain contacts and the additional gate contacts to a M1 layer above the gate electrodes and the TSs.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of printability issues and limited spacing between gate contacts and adjacent gate electrodes, which in turn reduces yield, attendant upon forming an SRAM bitcell with rectangular and square gate contacts, with rectangular contacts in the cross-couple region. In accordance with embodiments of the present disclosure, an SRAM bitcell is formed with all gate contacts having the same shape, which is a regular shape (in which all sides and angles are the same), such as a square. Also, the cross-couple is formed with overlapping gate and source/drain contacts rather than a rectangular gate contact.

Methodology in accordance with embodiments of the present disclosure includes forming first and second gate electrodes adjacent one another on a substrate. At least one TS is formed on the substrate between the first and second gate electrodes. A gate contact is formed on the first gate electrode, the gate contact having a regular shape. A source/drain contact is formed on a trench silicide between the first and second gate electrodes, wherein an upper portion of the source/drain contact overlaps an upper portion of the gate contact.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
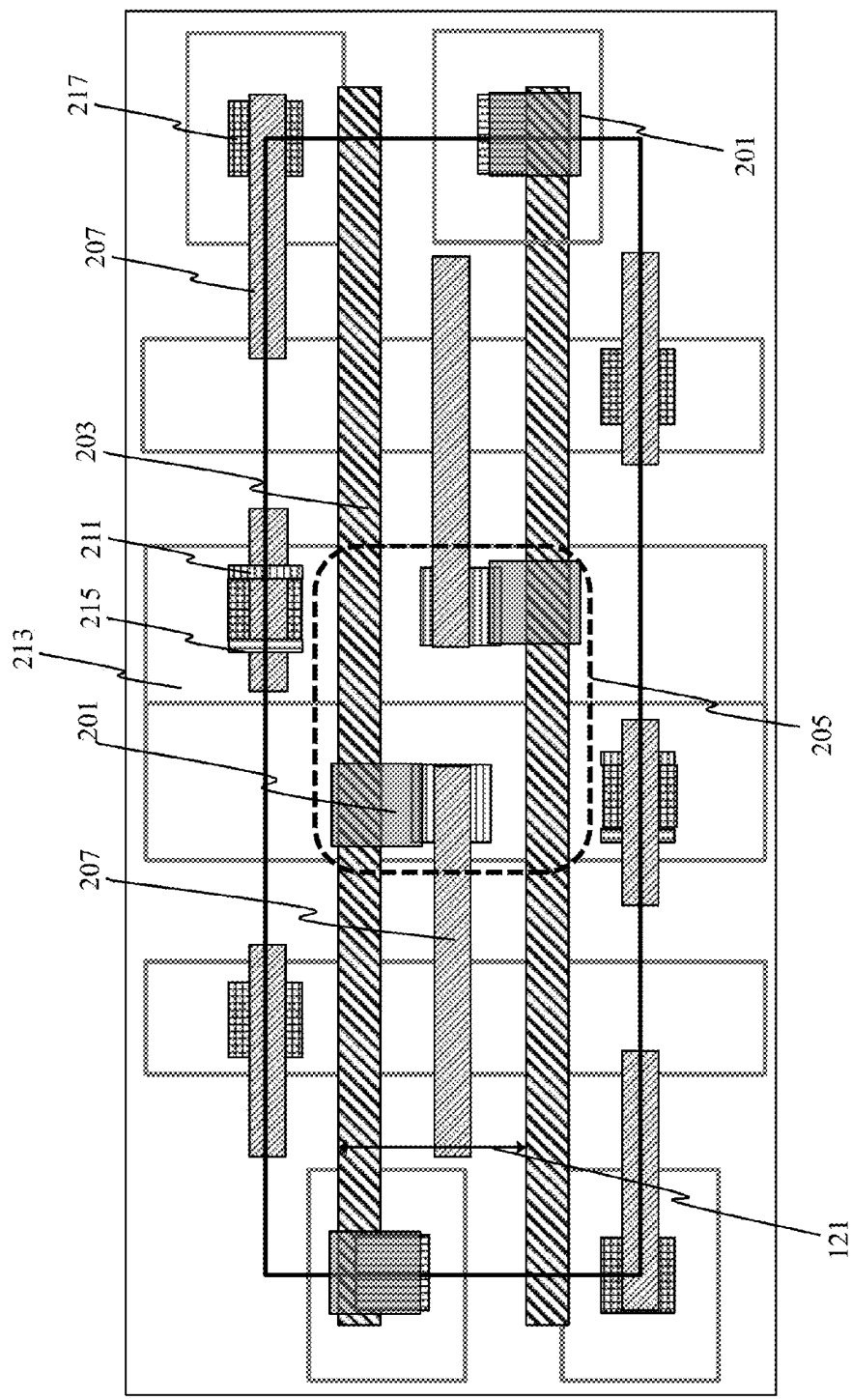
FIGS. 2A and 2B schematically illustrate layout and cross-sectional views of an SRAM bitcell, in accordance with an exemplary embodiment.
Figure 2B:
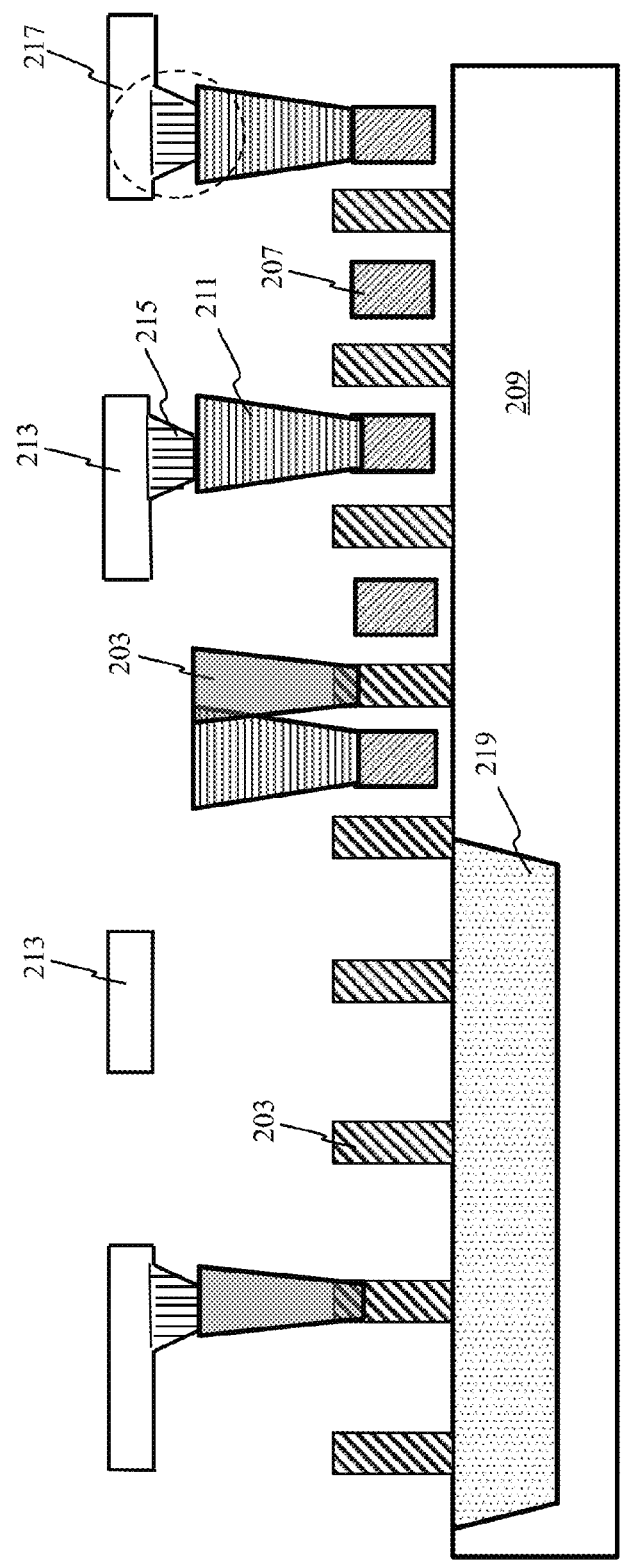

FIGS. 2A and 2B illustrate layout and cross-sectional views of an SRAM bitcell, in accordance with an exemplary embodiment. Adverting to FIGS. 2A and 2B, gate contacts 201 are formed in various locations over gate electrodes 203. In a cross-couple region 205, two gate electrodes 203 are cross-coupled. TSs 207 are formed between adjacent pairs of gate electrodes 203 on substrate 209. The gate electrodes 203 are parallel and evenly spaced. Source/drain contacts 211 are formed over TSs 207. Above the gate and source/drain contacts, an M1 layer 213 is formed, with segments of M1 layer 213 connected to gate or source/drain contacts through vias 215. Some source/drain contacts are the same size as the vias, for example at 217, and others merely overlap the vias. Further, some of the gate electrodes 203 are formed over an STI region 219 in substrate 209.

Figure 1A:
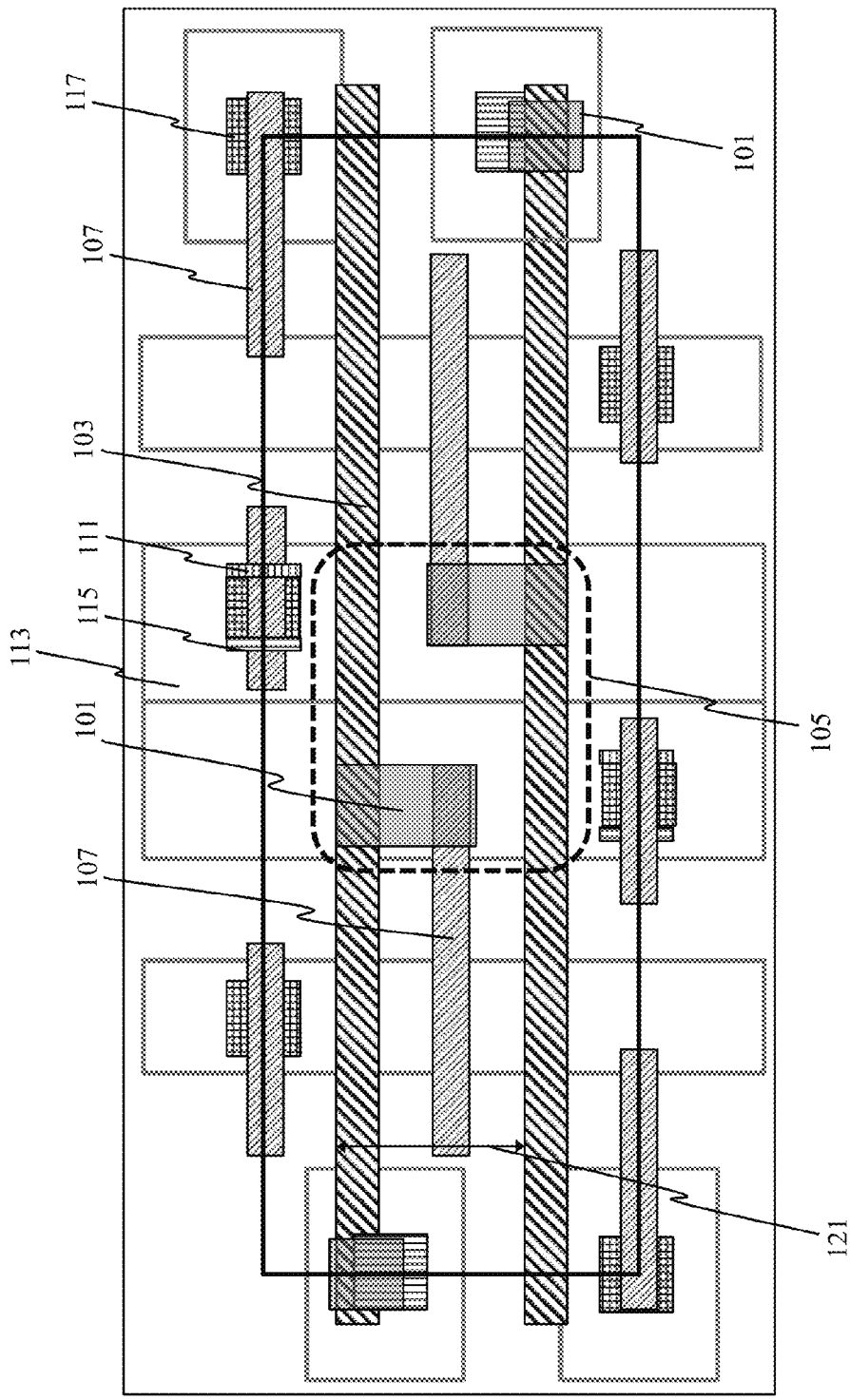
FIGS. 1A and 1B schematically illustrate layout and cross-sectional views of a conventional SRAM bitcell.
Figure 1B:
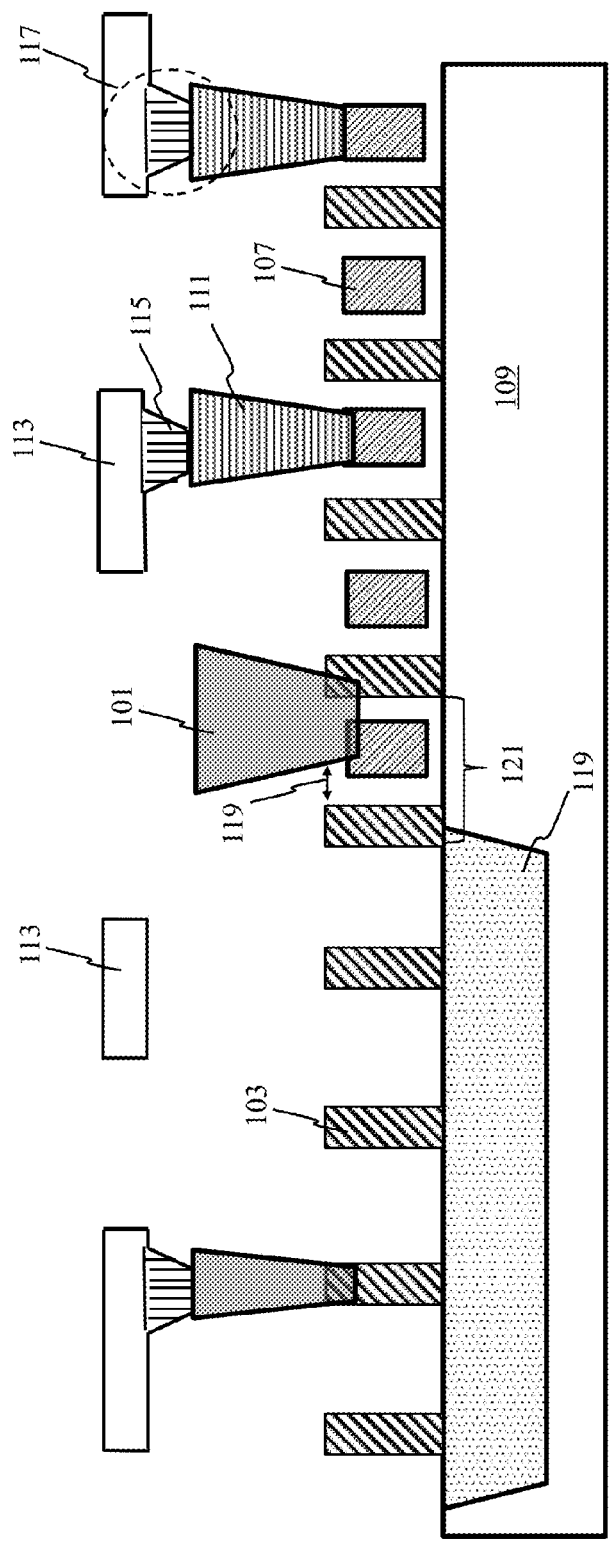

The SRAM bitcell of FIGS. 2A and 2B differs from the conventional SRAM bitcell illustrated in FIGS. 1A and 1B in that the gate contacts are all the same regular shape, e.g. squares. In addition, in cross-couple region 205, a gate contact 201 is formed on each of two adjacent gate electrodes 203 and source/drain contacts 211 are formed on TS 207 between the two gate electrodes 203. When the gate contacts and source/drain contacts are printed, the critical dimensions are enlarged, such that the bottom of each is the design size (for example the width of the gate contacts is the same as the width of the gate electrode), the etch profile is sloped, and the top of each is larger than the bottom. Accordingly, the gate contact and source/drain contact overlap at the top. The two contacts are merged at the top even if there is a misalignment between them. In addition, since the source/drain contact etch is a self-aligned process, it will not damage the gate electrode. Therefore, the merged contact will never touch the gate electrode, which will prevent the gate contact from bridging to an adjacent gate electrode.

The embodiments of the present disclosure can achieve several technical effects including improved printability and better yield for semiconductor device, such as SRAM bitcells, which include cross-coupling of gate electrodes. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for the 10 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming first and second gate electrodes adjacent one another on a substrate;
    forming at least one trench silicide (TS) on the substrate between the first and second gate electrodes;
    forming a gate contact on the first gate electrode, the gate contact having a regular shape;
    forming a source/drain contact on a trench silicide between the first and second gate electrodes, wherein a bottom of the source/drain contact is the same width as the trench silicide, and a bottom of the gate contact is the same width as the gate electrode; and
    forming a sloped profile of the gate contact and the source/drain contact, such that an upper portion of the gate contact is wider than the bottom of the gate contact and an upper portion of the source/drain contact is wider than the bottom of the source/drain contact, wherein the upper portion of the source/drain contact overlaps the upper portion of the gate contact.

2. The method according to claim 1, wherein the regular shape comprises a square.

3. The method according to claim 1, wherein the source/drain contact comprises a self-aligned contact.

4. The method according to claim 1, further comprising forming a second source/drain contact on a second TS between the first and second gate electrodes and a second gate contact having the regular shape on the second gate electrode, wherein an upper portion of the second source/drain contact overlaps an upper portion of the second gate contact.

5. The method according to claim 4, wherein the overlapping first gate contact and first source/drain contact and the overlapping second gate contact and second source/drain contact cross-couple the first and second gate electrodes.

6. The method according to claim 1, wherein a width of a bottom surface of the gate contact corresponds to a width of each of the first and second gate electrodes.

7. The method according to claim 1, further comprising:
    forming additional gate electrodes parallel to and spaced from the first and second gate electrodes;
    forming at least one additional TS between each pair of adjacent gate electrodes;
    forming at least one additional gate contact having the regular shape on at least one additional gate electrode; and
    forming at least one additional source/drain contact on one or more of the at least one additional TSs.

8. The method according to claim 7, further comprising connecting one or more of the additional source/drain contacts and the additional gate contacts to a first metal (M1) layer above the gate electrodes and the TSs.

9. A device comprising:
    first and second gate electrodes adjacent one another on a substrate;
    at least one trench silicide (TS) on the substrate between the first and second gate electrodes;
    a gate contact on the first gate electrode, the gate contact having a regular shape;
    a source/drain contact on a trench silicide between the first and second gate electrodes, wherein a bottom of the source/drain contact is the same width as the trench silicide, and a bottom of the gate contact is the same width as the gate electrode; and
    wherein the gate contact and the source/drain contact have sloped profiles, such that an upper portion of the gate contact is wider than the bottom of the gate contact and an upper portion of the source/drain contact is wider than the bottom of the source/drain contact, and the upper portion of the source/drain contact overlaps the upper portion of the gate contact.

10. The device according to claim 9, wherein the regular shape comprises a square.

11. The device according to claim 9, wherein the source/drain contact comprises a self-aligned contact.

12. The device according to claim 9, further comprising a second source/drain contact on a second TS between the first and second gate electrodes and a second gate contact having the regular shape on the second gate electrode, wherein an upper portion of the second source/drain contact overlaps an upper portion of the second gate contact.

13. The device according to claim 12, wherein the overlapping first gate contact and first source/drain contact and the overlapping second gate contact and second source/drain contact cross-couple the first and second gate electrodes.

14. The device according to claim 9, wherein a width of a bottom surface of the gate contact corresponds to a width of each of the first and second gate electrodes.

15. The device according to claim 9, further comprising:
    additional gate electrodes parallel to and spaced from the first and second gate electrodes;
    at least one additional TS between each pair of adjacent gate electrodes;
    at least one additional gate contact having the regular shape on at least one additional gate electrode; and
    at least one additional source/drain contact on one or more of the at least one additional TSs.

16. The device according to claim 15, further comprising one or more of the additional source/drain contacts and the additional gate contacts being connected to a first metal (M1) layer above the gate electrodes and the TSs.

17. A method comprising:
    forming plural parallel and equally spaced gate electrodes on a substrate;
    forming trench silicides (TSs) on the substrate between pairs of adjacent gate electrodes;
    forming gate contacts on plural gate electrodes, the gate contacts having a uniform, regular shape, where a width of a bottom surface of each gate contact corresponds to a width of each gate electrode;
    forming source/drain contacts on plural TSs, wherein an upper portion of a first source/drain contact on a first TS overlaps an upper portion of a first gate contact on an adjacent first gate electrode, and an upper portion of a second source/drain contact on the first TS overlaps an upper portion of a second gate contact on a second gate electrode adjacent the first TS, cross-coupling the first and second gate electrodes,
    wherein the upper portion of the first source/drain contact has a width greater than the width of a bottom surface of the first source/drain contact and the upper portion of the second source/drain contact has a width greater than the width of a bottom surface of the second source/drain contact.

18. The method according to claim 17, wherein the regular shape comprises a square.

19. The method according to claim 17, wherein the source/drain contacts comprise self-aligned contacts.

20. The method according to claim 17, further comprising connecting one or more additional source/drain contacts and additional gate contacts to a first metal (M1) layer above the gate electrodes and the TSs.

21. The method according to claim 17, wherein the upper portion of the first gate contact is wider than the bottom surface of the first gate contact and the upper portion of the second gate contact is wider than the bottom surface of the second gate contact.

\* \* \* \* \*